United States Patent
Nishikawa et al.

(10) Patent No.: US 7,482,111 B2
(45) Date of Patent: Jan. 27, 2009

(54) NEGATIVE RADIATION-SENSITIVE RESIN COMPOSITION

(75) Inventors: Kouji Nishikawa, Chuo-ku (JP); Tooru Kimura, Chuo-ku (JP); Shin-ichiro Iwanaga, Chuo-ku (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/593,972

(22) PCT Filed: Mar. 24, 2005

(86) PCT No.: PCT/JP2005/005417

§ 371 (c)(1),
(2), (4) Date: Sep. 22, 2006

(87) PCT Pub. No.: WO2005/091072

PCT Pub. Date: Sep. 29, 2005

(65) Prior Publication Data

US 2007/0190450 A1    Aug. 16, 2007

(30) Foreign Application Priority Data

Mar. 24, 2004    (JP) .............................. 2004-087521

(51) Int. Cl.
*G03F 7/40*     (2006.01)
*H01L 21/027*   (2006.01)
*G03F 7/033*    (2006.01)
*G03F 7/037*    (2006.01)

(52) U.S. Cl. ................. 430/314; 430/281.1; 430/285.1; 430/283.1; 430/906; 430/910; 430/920; 430/918; 430/916; 430/919; 430/925; 430/272.1; 522/18

(58) Field of Classification Search ....................... None
See application file for complete search history.

(56) References Cited

U.S. PATENT DOCUMENTS

| | | | | |
|---|---|---|---|---|
| 4,990,428 A | * | 2/1991 | Shimizu et al. | 430/276.1 |
| 5,068,689 A | * | 11/1991 | Sasa et al. | 355/107 |
| 5,310,862 A | * | 5/1994 | Nomura et al. | 528/353 |
| 5,573,889 A | * | 11/1996 | Hofmann et al. | 430/285.1 |
| 5,776,995 A | * | 7/1998 | Obiya et al. | 522/15 |
| 6,010,824 A | * | 1/2000 | Komano et al. | 430/281.1 |
| 6,426,176 B1 | * | 7/2002 | Danielson et al. | 430/315 |
| 2007/0237890 A1 | * | 10/2007 | Sakai et al. | 427/98.4 |

FOREIGN PATENT DOCUMENTS

| JP | 07 005684 | 1/1995 |
|---|---|---|
| JP | 08 179505 | 7/1996 |
| JP | 2000-39709 | 2/2000 |
| JP | 2000 039709 | 2/2000 |
| JP | 2002 214780 | 7/2002 |
| JP | 2003-241372 | 8/2003 |

OTHER PUBLICATIONS

English translation of JP 08-179505 A (1996) from machine translation from AIPN Japan Patent Office Natinal center for Industrial Property Information and Training, generated Jul. 26, 2007, 19 pages.*
Monroe et al, "Photoinitiators for free-radical-initiated photoimaging systems", Chemical Reviews, vol. 93, No. 1, Jan.-Feb. 1993. p. 435-448.*
RN 24650-42-8, Registry file entered STN: Nov. 16, 1984 from STN International, ACS on STN, 2 pages.*

* cited by examiner

*Primary Examiner*—Cynthia Hamilton
(74) *Attorney, Agent, or Firm*—Oblon, Spivak, McClelland, Maier & Neustadt, P.C.

(57) ABSTRACT

It is an object of the present invention to provide a process capable of precisely producing a plated shaped article of a large thickness such as a bump or a wiring, a negative radiation-sensitive resin composition which is preferably used for the process and has excellent sensitivity and resolution, and a transfer film using the composition. The above object is achieved by a negative radiation-sensitive resin composition comprising (A) a polymer containing structural units represented by the following formula (1) and/or the following formula (2), (B) a compound having at least one ethylenically unsaturated double bond and (C) a radiation-sensitive radical polymerization initiator, and by forming a negative radiation-sensitive resin film using the composition.

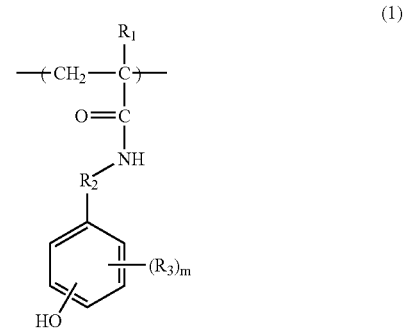

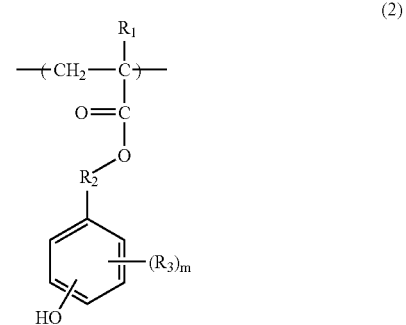

9 Claims, No Drawings

NEGATIVE RADIATION-SENSITIVE RESIN COMPOSITION

TECHNICAL FIELD

The present invention relates to a negative radiation-sensitive resin composition preferably used for producing a plated shaped article, a transfer film using the composition and a process for producing a plated shaped article.

BACKGROUND ART

With downsizing of electronic equipment such as cellular phone, much higher integration and more multilayer metallization of large-scale integrated circuits (LSI) have been rapidly promoted recently. On that account, a multi-pin mounting process for mounting LSI on a substrate in order to mount the LSI on electronic equipment is necessary, and there has been paid attention bare chip mounting using a tape automated bonding (TAB) method or a flip chip method. In such a multi-pin mounting process, it is necessary to precisely arrange on a LSI chip a protruded electrode called a bump that is a connecting terminal.

In order to obtain various precision parts such as a bump, precision fine processing technology is necessary, and the main stream of this technology is photo application at present. The photo application is a general term of technology for manufacturing various precision parts, said technology comprising applying a radiation-sensitive resin composition to a surface of a workpiece to form a film, patterning the film by photolithography and carrying out chemical etching, electroetching and electroforming (mainly electroplating) singly or in combination using the resulting pattern as a mask.

More specifically, a bump is produced by the following procedure. First, a barrier metal that becomes an electrically conductive layer is laminated on a wafer having been worked as a LSI device, and then a radiation-sensitive resin composition, i.e., so-called a resist, is applied and dried. Subsequently, the resist is irradiated with radiation (referred to as "exposure" hereinafter) through a mask so as to form an opening corresponding to the place where a bump is to be formed, and then the resist is developed to form a pattern. Thereafter, using the pattern as a mold, electroplating is performed to deposit an electrode material such as gold or copper. Then, the resin portion is stripped, and the barrier metal is removed by etching. Thereafter, a square chip is cut out from the wafer, followed by a step of mounting such as packaging (e.g., TAB), a flip chip method or the like.

With regard to a shape of the bump, there are bumps of various shapes, such as ball bump, mushroom bump, straight bump, etc., and with regard to a height of the bump, the main stream of conventional bumps is a bump having a height of not less than 15 μm, more specifically about 20 to 30 μm.

The present inventors have already proposed a radiation-sensitive resin composition which can be preferably used for photo application (see patent document 1). If this composition is used, formation of a resin film having a film thickness of 20 to 30 μm is possible, and it becomes possible to form a bump having a height of about 20 to 30 μm. Moreover, it is also possible to form a highly precise bump because the composition has been improved in adhesion to a base in the pattern developing step, wettability by a plating solution and resistance to a plating solution.

By the way, in the case where a LSI chip is connected to a substrate through a bump as described above, a stress is caused by a difference in coefficient of linear thermal expansion between the LSI chip and the substrate, and the LSI chip and the substrate are sometimes disconnected from each other. To inhibit such connection failure and to enhance reliability of the device, it is desirable to increase the amount of gold or solder of the bump that is a connecting portion to thereby relax the stress. In this case, if the distance between bumps (also referred to as a "pitch" hereinafter) is relatively large as in the conventional devices, the amount of gold or solder can be secured by increasing the area of the gold or solder portion. However, if the pitch is narrowed with the demand for bumps of high precision, the area of the gold or solder portion cannot be increased, and hence, it becomes necessary to increase the height of the bump to secure the amount of gold or solder.

In recent years, therefore, there is a marked tendency to highly precisely form a bump having a greater height (also referred to a "high bump" hereinafter) on a LSI chip (also referred to as a "chip" simply hereinafter) by photo application. However, if a radiation-sensitive resin composition that is used for usual bump formation is used, it is difficult to form a resin film having a film thickness necessary for forming a high bump on a chip base. Even if a resin film of such a film thickness can be formed, the portion near the base is not sufficiently cured by irradiation with radiation because of low radiation transmittance, though the surface layer is cured, and as a result, a desired pattern cannot be obtained with high precision.

The present inventors have already proposed a radiation-sensitive resin composition that is preferable for forming such a high bump. By the use of this composition, a resin film having a sufficient film thickness, e.g., a dry film thickness of not less than 50 μm, can be formed on a chip substrate, and therefore, this composition can be preferably used for forming a high bump. Moreover, because this resin composition has excellent radiation transmittance, the resin film composed of the composition can be sufficiently cured even at the portion near the substrate. Accordingly, a desired pattern can be obtained with high precision by photolithography (see patent document 2).

In the case where a high bump is formed using a resin film composed of the above composition, however, a plating solution sometimes comes into the interface between the substrate and the resin film in the plating step because the adhesion between the resin film and the substrate in the developing step is not sufficient. Moreover, because of insufficient wettability of the resin film by a plating solution, plating defects sometimes take place.

Patent document 1: Japanese Patent Laid-Open Publication No. 39709/2000

Patent document 2: Japanese Patent Laid-Open Publication No. 241372/2003

DISCLOSURE OF THE INVENTION

Problem to be Solved by the Invention

It is an object of the present invention to provide a process capable of precisely producing a plated shaped article of a large thickness such as a bump or a wiring, a negative radiation-sensitive resin composition which is preferably used for the process and has excellent sensitivity and resolution, and a transfer film using the composition.

Means to Solve the Problem

Under such circumstances as described above, the present inventors have earnestly studied, and as a result, they have found that a high bump can be precisely formed by the use of a negative radiation-sensitive resin composition comprising (A) a polymer containing a constituent unit derived from a monomer having a specific structure, (B) a compound having at least one ethylenically unsaturated double bond and (C) a radiation radical polymerization initiator, or by the use of a transfer film comprising the composition. Based on the finding, the present invention has been accomplished.

The negative radiation-sensitive resin composition according to the present invention comprises:

(A) a polymer containing structural units represented by the following formula (1) and/or the following formula (2):

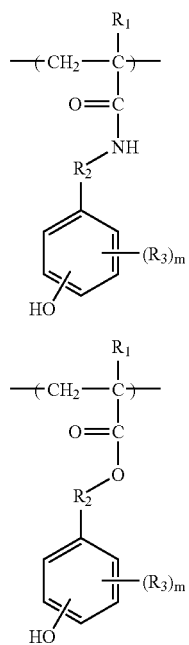

wherein $R_1$ is a hydrogen atom or a methyl group, $R_2$ is $-(CH_2)_n-$, n is an integer of 0 to 3, $R_3$ is an alkyl group of 1 to 4 carbon atoms, and m is an integer of 0 to 4, (B) a compound having at least one ethylenically unsaturated double bond, and (C) a radiation-sensitive radical polymerization initiator.

The composition of the invention is preferably used for producing a plated shaped article, particularly a bump.

In the negative radiation-sensitive resin composition, the component (B) is preferably contained in an amount of 30 to 80 parts by weight based on 100 parts by weight of the component (A), and the component (C) is preferably contained in an amount of 15 to 30 parts by weight based on 100 parts by weight of the component (A).

The negative radiation-sensitive resin composition of the invention may further comprise an organic solvent.

The transfer film according to the present invention has a resin film composed of the above resin composition. The resin film preferably has a film thickness of 5 to 200 μm.

The process for producing a plated shaped article according to the present invention comprises:

(1) a step of forming a resin film composed of the above-mentioned negative radiation-sensitive resin composition on a wafer having a barrier metal layer, (2) a step of exposing the resin film and then developing the resin film to form a pattern, (3) a step of depositing an electrode material by electroplating using the pattern as a mold, and (4) a step of stripping the remaining resin film and then removing the barrier metal by etching.

Effect of the Invention

By the use of the radiation-sensitive resin composition of the invention, a resin film capable of highly precisely and readily forming a high bump having a height of 20 to 200 μm can be formed on a chip base. By virtue of this, connection failure of a device can be inhibited and reliability of the device can be enhanced.

BEST MODE FOR CARRYING OUT THE INVENTION

The negative radiation-sensitive resin composition of the invention is a negative radiation-sensitive resin composition comprising:

(A) a polymer containing structural units represented by the following formula (1) and/or the following formula (2):

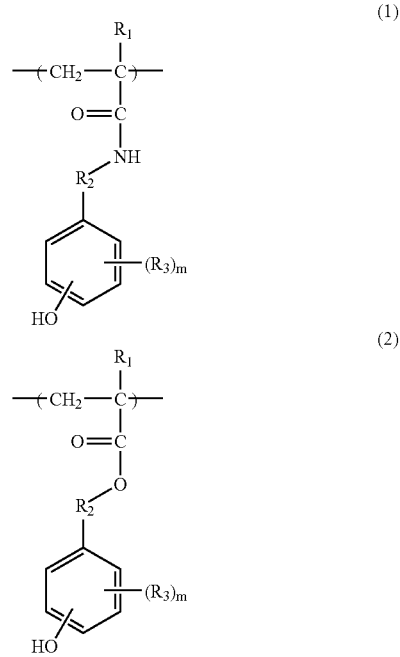

wherein $R_1$ is a hydrogen atom or a methyl group, $R_2$ is $-(CH_2)_n-$, n is an integer of 0 to 3, $R_3$ is an alkyl group of 1 to 4 carbon atoms, and m is an integer of 0 to 4, (B) a compound having at least one ethylenically unsaturated double bond, and (C) a radiation-sensitive radical polymerization initiator.

First, each component is described.

(A) Polymer

The polymer (A) for use in the invention is a polymer containing structural units represented by the above formula (1) and/or the above formula (2).

Because the polymer (A) contains structural units represented by the formula (1) and/or the formula (2), an effect of increasing adhesion of a resist to a substrate and thereby preventing introduction of a plating solution into the interface between the substrate and the resist in the plating step is exerted. Further, because the amide or ester site contained in the structural unit increases affinity of a resist for a plating solution, an effect of increasing wettability of the resist by a plating solution and thereby preventing plating defects in the plating step is exerted. Furthermore, by controlling the type and the number of substituents contained in the structural unit, degree of acidity of the phenolic hydroxyl group can be changed, and solubility of the resist in an alkali developing solution can be controlled.

The alkali developing solution used for developing the exposed resin film is a solution obtained by dissolving one or more kinds of alkaline compounds in water or the like. After development with the alkali developing solution is carried out, washing with water is usually carried out.

The total amount of the structural units represented by the formula (1) and the formula (2) in the polymer (A) is in the range of usually 1 to 30% by weight, preferably 5 to 20% by weight.

When the total amount of the structural units represented by the formula (1) and the formula (2) in the polymer (A) is in the above range, a molecular weight of the resulting polymer (A) can be sufficiently increased. In addition, formation of a resin film having a film thickness of not less than 50 μm becomes possible, and resolution of the resulting radiation-sensitive resin film becomes excellent.

Monomer (1') and Monomer (2')

The structure of the formula (1) can be obtained by polymerizing a monomer (1') represented by the following formula to form the polymer (A).

The structure of the formula (2) can be obtained by polymerizing a monomer (2') represented by the following formula to form the polymer (A).

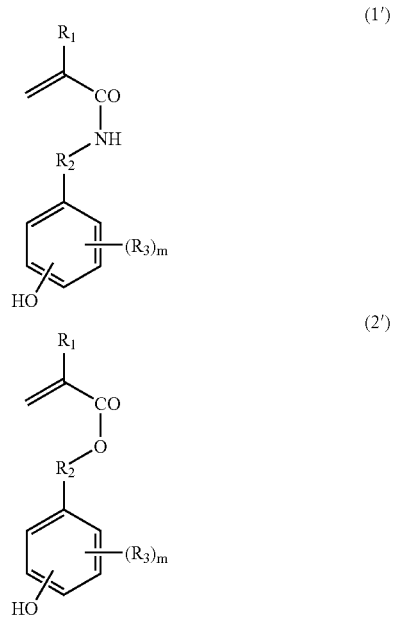

wherein $R_1$ is a hydrogen atom or a methyl group, $R_2$ is $-(CH_2)_n-$, n is an integer of 0 to 3, $R_3$ is an alkyl group of 1 to 4 carbon atoms, and m is an integer of 0 to 4.

Examples of the monomers (1') include p-hydroxyphenyl acrylamide, p-hydroxyphenyl methacrylamide, o-hydroxyphenyl acrylamide, o-hydroxyphenyl methacrylamide, m-hydroxyphenyl acrylamide, m-hydroxyphenyl methacrylamide, p-hydroxybenzyl acrylamide, p-hydroxybenzyl methacrylamide, 3,5-dimethyl-4-hydroxybenzyl acrylamide, 3,5-dimethyl-4-hydroxybenzyl methacrylamide, 3,5-tert-butyl-4-hydroxybenzyl acrylamide, 3,5-tert-butyl-4-hydroxybenzyl methacrylamide, o-hydroxybenzyl acrylamide and o-hydroxybenzyl methacrylamide.

Examples of the monomers (2') include p-hydroxyphenyl (meth)acrylate, o-hydroxyphenyl (meth)acrylate, m-hydroxyphenyl (meth)acrylate, p-hydroxybenzyl (meth)acrylate, 3,5-dimethyl-4-hydroxybenzyl (meth)acrylate, 3,5-tert-butyl-4-hydroxybenzyl (meth)acrylate and o-hydroxybenzyl (meth)acrylate.

Of the above monomers (1') and (2'), preferable are p-hydroxyphenyl acrylamide, p-hydroxyphenyl methacrylamide, 3,5-dimethyl-4-hydroxybenzyl acrylamide and 3,5-dimethyl-4-hydroxybenzyl methacrylamide.

The monomers (1') or the monomers (2') can be used singly or as a mixture of two or more kinds. Further, the monomer (1') and the monomer (2') may be used in combination.

Monomer (I)

The polymer (A) may further contain constituent units derived from a copolymerizable monomer (referred to as a "monomer (I)" hereinafter) other than the monomers (1') and (2').

Examples of the monomers (I) include:

aromatic vinyl compounds, such as o-hydroxystyrene, m-hydroxystyrene, p-hydroxystyrene, p-isopropenylphenol, styrene, α-methylstyrene, p-methylstyrene and p-methoxystyrene;

hetero atom-containing alicyclic vinyl compounds, such as N-vinylpyrrolidone and N-vinylcaprolactam;

cyano group-containing vinyl compounds, such as acrylonitrile and methacrylonitrile;

conjugated diolefins, such as 1,3-butadiene and isoprene;

amide group-containing vinyl compounds, such as acrylamide and methacrylamide;

carboxyl group-containing vinyl compounds, such as acrylic acid and methacrylic acid; and (meth)acrylic esters, such as methyl (meth)acrylate, ethyl (meth)acrylate, n-propyl (meth)acrylate, n-butyl (meth)acrylate, 2-hydroxyethyl (meth)acrylate, 2-hydroxypropyl (meth)acrylate, polyethylene glycol mono(meth)acrylate, polypropylene glycol mono(meth)acrylate, glycerol mono(meth)acrylate, phenyl (meth)acrylate, benzyl (meth)acrylate, cyclohexyl (meth)acrylate, isobornyl (meth)acrylate and tricyclodecanyl (meth)acrylate.

Of the above monomers (I), preferable are p-hydroxystyrene, p-isopropenyphenol, styrene, acrylic acid, methacrylic acid, methyl (meth)acrylate, ethyl (meth)acrylate, n-butyl (meth)acrylate, tricyclodecanyl (meth)acrylate, benzyl (meth)acrylate and isobornyl (meth)acrylate.

The monomers (I) can be used singly or as a mixture of two or more kinds.

The polymer (A) can be prepared by, for example, radical polymerization. Examples of the polymerization processes include emulsion polymerization, suspension polymerization, solution polymerization and bulk polymerization. Of these, solution polymerization is particularly preferable.

Polymerization Initiator

As the polymerization initiator for use in the preparation of the polymer (A), a usual radical polymerization initiator is employable.

Examples of such polymerization initiators include:

azo compounds, such as 2,2'-azobisisobutyronitrile, 2,2'-azobis-(2,4-dimethylvaleronitrile), 2,2'-azobis-(4-methoxy-2,4-dimethylvaleronitrile), 2,2'-azobis-(2-methylbutyronitrile), 1,1'-azobis-(cyclohexane-1-carbonitrile) and dimethyl-2,2'-azobis-(2-methylpropionate);

organic peroxides, such as benzoyl peroxide, lauroyl peroxide, tert-butyl peroxypivalate and 1,1'-bis-(tert-butylperoxy)cyclohexane; and hydrogen peroxide.

When the organic peroxide is used as the radical polymerization initiator, a reducing agent may be used in combination to form an initiator of redox type.

Polymerization Solvent

As the polymerization solvent that is used when the polymer (A) is prepared by solution polymerization, any solvent is employable without restriction provided that it has no reactivity to the monomer components used and is capable of dissolving the resulting polymer.

Examples of such polymerization solvents include:

alcohols, such as methanol, ethanol, ethylene glycol, diethylene glycol and propylene glycol;

cyclic ethers, such as tetrahydrofuran and dioxane;

alkyl ethers of polyhydric alcohols, such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethylmethyl ether, propylene glycol monomethyl ether and propylene glycol monoethyl ether;

alkyl ether acetates of polyhydric alcohols, such as ethylene glycol monoethyl ether acetate, diethylene glycol ethyl ether acetate, propylene glycol ethyl ether acetate and propylene glycol monomethyl ether acetate;

aromatic hydrocarbons, such as toluene and xylene;

ketones, such as acetone, methyl ethyl ketone, methyl isobutyl ketone, cyclohexanone, 4-hydroxy-4-methyl-2-pentanone and diacetone alcohol; and esters, such as ethyl acetate, butyl acetate, ethyl 2-hydroxypropionate, ethyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, ethyl acetate, butyl acetate and ethyl lactate.

Of the above solvents, preferable are cyclic ethers, alkyl ethers of polyhydric alcohols, alkyl ether acetates of polyhydric alcohols, ketones and esters.

The polymer (A) obtained by the above radical copolymerization has a weight-average molecular weight (Mw) in terms of polystyrene, as measured by gel permeation chromatography, of usually 1,000 to 100,000, preferably 2,000 to 50,000, more preferably 3,000 to 20,000.

(B) Compound Having at Least One Ethylenically Unsaturated Double Bond

The compound (B) for use in the invention is a compound which has at least one ethylenically unsaturated group in a molecule and is liquid or solid at ordinary temperature. As the compound (B), a (meth)acrylate compound having a (meth)acryloyl group or a compound having a vinyl group is preferably employed. The (meth)acrylate compounds are classified into monofunctional compounds and polyfunctional compounds, and any of them is employable.

Examples of the monofunctional (meth)acrylate compounds include 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, isobutyl (meth)acrylate, tert-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecylamyl (meth)acrylate, lauryl (meth)acrylate, octadecyl (meth)acrylate, stearyl (meth)acrylate, tetrahydrofurfuryl (meth)acrylate, butoxyethyl (meth)acrylate, ethoxydiethylene glycol (meth)acrylate, benzyl (meth)acrylate, cyclohexyl (meth)acrylate, phenoxyethyl (meth)acrylate, polyethylene glycol mono(meth)acrylate, polypropylene glycol mono (meth) acrylate, methoxyethylene glycol (meth) acrylate, ethoxyethyl (meth)acrylate, methoxypolyethylene glycol (meth) acrylate, phenoxypolyethylene glycol (meth) acrylate, phenoxypolypropylene glycol (meth)acrylate, methoxypolypropylene glycol (meth)acrylate, tricyclo[$5.2.1.0^{2,6}$]decadienyl (meth)acrylate, tricyclo [$5.2.1.0^{2,6}$]decanyl (meth)acrylate, tricyclo[$5.2.1.0^{2,6}$]decenyl (meth)acrylate, isobornyl (meth)acrylate, bornyl (meth)acrylate, diacetone (meth)acrylamide, isobutoxymethyl (meth)acrylamide, N-vinylpyrrolidone, N-vinylcaprolactam, N,N-dimethyl (meth)acrylamide, tert-octyl (meth)acrylamide, dimethylaminoethyl (meth)acrylate, diethylaminoethyl (meth)acrylate, 7-amino-3,7-dimethyloctyl (meth)acrylate, dimethyl maleate, diethyl maleate, dimethyl fumarate, diethyl fumarate, ethylene glycol monomethyl ether (meth)acrylate, ethylene glycol monoethyl ether (meth)acrylate, glycerol (meth)acrylate, acrylamide, methacrylamide and (meth)acrylonitrile.

Examples of the polyfunctional (meth)acrylate compounds include trimethylolpropane tri(meth)acrylate, ethylene glycol di(meth)acrylate, tetraethylene glycol di(meth)acrylate, polyethylene glycol di(meth)acrylate, 1,4-butanediol di(meth)acrylate, butylene glycol di(meth)acrylate, propylene glycol di(meth)acrylate, timethylolpropane di(meth)acrylate, 1,6-hexanediol di(meth)acrylate, neopentyl glycol di(meth)acrylate, tris(2-hydroxyethyl)isocyanurate tri(meth)acrylate, tris(2-hydroxyethyl)isocyanurate di(meth)acrylate, tricyclodecanedimethanol di(meth)acrylate, epoxy (meth)acrylate obtained by addition of (meth)acrylic acid to diglycidyl ether of bisphenol A, bisphenol A di(meth)acryloyloxyethyl ether, bisphenol A di(meth)acryloyloxyethyloxyethyl ether, bisphenol A di(meth)acryloyloxyloxymethylethyl ether, tetramethylolpropane tetra(meth)acrylate, pentaerythritol tri(meth)acrylate, pentaerythritol tetra(meth)acrylate, dipentaerythritol penta(meth)acrylate and dipentaerythritol hexa (meth)acrylate.

As the ethylenically unsaturated compound (B), a commercially available compound is also employable as it is. Examples of such commercially available compounds include Aronix M-210, M-309, M-310, M-400, M-7100, M-8030, M-8060, M-8100, M-9050, M-240, M-245, M-6100, M-6200, M-6250, M-6300, M-6400 and M-6500 (all available from Toagosei Co., Ltd.), KAYARAD R-551, R-712, KAYARAD TMPTA, KAYARAD HDDA, KAYARAD TPGDA, KAYARAD PEG400DA, KAYARAD MANDA, KAYARAD HX-220, HX-620, KAYARAD R-604, KAYARAD DPCA-20, DPCA-30, DPCA-60 and DPCA-120 (all available from Nippon Kayaku Co., Ltd.), and Biscoat #295, #300, #260, #312, #335HP, #360, #GPT, #3PA and #400 (all available from Osaka Organic Chemical Industry Ltd.).

The compounds (B) may be used singly or in combination of two or more kinds.

The compound (B) is used in an amount of usually 30 to 80 parts by weight, preferably 40 to 70 parts by weight, based on 100 parts by weight of the polymer (A) having alkali-solubility. When the amount of the compound (B) is in the above range, the resulting radiation-sensitive resin film exhibits excellent sensitivity in the exposure step, the compound (B) has excellent compatibility with the polymer (A), and storage stability of the coating solution is improved.

(C) Radiation Rradical Polymerization Initiator

The radiation radical polymerization initiator (C) for use in the invention generates radicals upon irradiation with radiation and initiates radical polymerization of the ethylenically unsaturated compound (B). This initiator (C) is not specifically restricted as long as it has radical generation ability.

The radiation means ultraviolet radiation, visible light, far ultraviolet radiation, X rays, electron beam or the like. As a source of radiation for curing the radiation-sensitive resin, a mercury lamp is usually used. Of light emission spectra of the mercury lamp, i-rays having a wavelength of 365 nm or h-rays having a wavelength of 405 nm are generally used for curing the radiation-sensitive resin.

The i-rays have high energy and high curing ability, so that the resin film hardly suffers curing inhibition caused by oxygen, but the i-rays are liable to be absorbed because of short wavelength. On that account, if the i-rays are used for curing a radiation-sensitive resin film of a large thickness, sufficient energy does not reach the bottom of the radiation-sensitive resin film, and hence, a desired pattern is not formed in the resin film occasionally. For example, the sectional shape of the radiation-sensitive resin film obtained after patterning is not a rectangle occasionally, or the sectional shape is sometimes such a trapezoid that the bottom of the radiation-sensitive resin film is more scooped than the surface layer portion.

On the other hand, the h-rays have low energy, so that curing takes much time. On that account, the surface of the radiation-sensitive resin film is liable to suffer curing inhibition caused by oxygen, and hence, the retention of the film after patterning is sometimes markedly lowered. However, the h-rays have higher light transmittance because they have longer wavelength than the i-rays. Therefore, even when the h-rays are used for a radiation-sensitive resin film of a large thickness, energy readily reaches even the bottom of the radiation-sensitive resin film. Hence, the sectional shape of the radiation-sensitive resin film after patterning becomes a rectangle, and a desired pattern is readily formed in the resin film.

The i-rays and the h-rays have the above properties, and in order to obtain a highly precise desired pattern wherein not only the surface layer portion but also the bottom of the radiation-sensitive resin film are sufficiently cured, the radiation-sensitive resin composition of the invention preferably satisfies the following requirements.

When a resin film having a dry film thickness of 70 μm is formed from the composition, (1) the i-ray (radiation of 365 nm) transmittance of the resin film is preferably not less than 10%, more preferably 12 to 30%, and (2) the h-ray (radiation of 405 nm) transmittance of the resin film is preferably not less than 60%, more preferably 65 to 80%.

If a radiation-sensitive resin film having a film thickness of 20 to 200 μm is formed from the composition having the above properties and if the resin film is irradiated with i-rays and h-rays, a highly precise desired pattern wherein not only the surface layer portion but also the bottom of the radiation-sensitive resin film have been sufficiently cured can be obtained.

That is to say, by increasing transmittances at both of the wavelengths, decay of light traveling from the surface to the inside of the radiation-sensitive resin film is inhibited, and the radiation-sensitive resin film is cured uniformly throughout the film, whereby a cured film having a section of the patterned portion in which a base and a side wall meet at about right angles can be obtained. By virtue of this, it becomes possible to form a high bump of straight shape with high precision.

Measurement of the radiation transmittance can be carried out by, for example, the following method.

First, an ethyl lactate solution (65% by weight) of a composition containing (A) the polymer, (B) the compound having at least one ethylenically unsaturated double bond and (C) the radiation radical polymerization initiator in given amounts is prepared, then the composition is applied onto a quartz substrate having a thickness of 1 mm by spin coating to form a resin film, and thereafter, the film is baked on a hot plate at 120° C. for 5 minutes to evaporate a solvent and thereby form a coating film. In this case, the number of revolutions in the spin coating is previously controlled so that the film thickness of the coating film after baking should become 70 μm.

The resin film formed on the quartz substrate as above is measured on the transmittance at a wavelength of 300 nm to 500 nm by means of a spectrophotometer (e.g., HITACHI Spectrophotometer U-2010), while a quartz substrate with no resin film is used as a reference.

Further, the resin composition of the invention is preferably a composition having the following properties:

when a resin film in an uncured state having a dry film thickness of 70 μm is formed from the composition and when the absorbance of the resin film is converted to an absorption coefficient, (1) the absorption coefficient of the resin film, as measured regarding a radiation of 365 nm, is not more than 15000 m$^{-1}$, and (2) the absorption coefficient of the resin film, as measured regarding a radiation of 405 nm, is not more than 4000 m$^{-1}$.

The absorption coefficient ε can be determined by applying the measured transmittance to the equation $\epsilon = \log(I_0/I)/L$ (wherein ε is an absorption coefficient (m$^{-1}$), I is a light intensity (cd) immediately after the light is transmitted by the resin film, $I_0$ is a light intensity (cd) before the light is transmitted by the resin film, and L is a dry film thickness (m) of the resin film).

For obtaining a resin composition having such preferred absorption coefficients, the type and the amount of the radiation radical polymerization initiator (C) are selected so that the resin composition should have the preferred absorption coefficients.

Examples of the radiation radical polymerization initiators (C) include acylphosphine oxides, such as 2,4,6-trimethyl-benzoyldiphenylphosphine oxide and bis-(2,6-dimethoxy-benzoyl)-2,4,4-trimethylpentylphosphine oxide; 2,2-dimethoxy-1,2-diphenylethane-1-one, benzyl dimethyl ketal, benzyl-β-methoxyethyl acetal, 1-phenyl-1,2-propanedione-2-(o-ethoxycarbonyl)oxime and 2,2'-bis(2,4-dichlorophenyl)-4,5,4',5'-tetraphenyl-1,2'-bisimidazole. Examples of commercially available ones include Lucirin TPO (available from BASF Corporation) and Irgacure 651 (available from Ciba Specialty Chemicals Inc.). These compounds can be used singly or in combination of two or more kinds.

Of the above compounds, 2,2-dimethoxy-1,2-diphenylethane-1-one, 2,4,6-trimethylbenzoyldiphenylphosphine oxide and 2,2'-bis(2,4-dichlorophenyl)-4,5,4',5'-tetraphenyl-1,2'-bisimidazole are preferably used in combination.

The radiation radical polymerization initiator is added in an amount of usually 10 to 40 parts by weight, preferably 15 to 30 parts by weight, more preferably 18 to 28 parts by weight, based on 100 parts by weight of the polymer (A).

By selecting the type of the radiation radical polymerization initiator and by using the initiator in the above amount, transmittances at both wavelengths of the i-rays and the h-rays can be enhanced, and not only the surface layer but also the bottom of the radiation-sensitive resin film can be sufficiently cured. Further, because an influence (lowering of sensitivity) of deactivation of radicals due to oxygen on the radiation-sensitive resin film is inhibited, a desired pattern can be obtained with high precision. Moreover, compatibility in the coating solution and storage stability of the coating solution can be improved.

Organic Solvent (D)

In the resin composition of the invention, an organic solvent may be contained when needed. As the organic solvent (D), a solvent capable of homogeneously dissolving the polymer (A) and other components and unreactive to each component is employed, and as such an organic solvent, the same solvent as the polymerization solvent used for preparing the polymer (A) is employable. Also employable are high-boiling point solvents, such as N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenyl cellosolve acetate.

Of the above solvents, preferable from the viewpoints of dissolving power, reactivity to each component and ease of resin film formation are:

alkyl ethers of polyhydric alcohols, such as ethylene glycol monoethyl ether and diethylene glycol monomethyl ether;

alkyl ether acetates of polyhydric alcohols, such as ethylene glycol monoethyl ether acetate and propylene glycol monomethyl ether acetate;

esters, such as ethyl 3-ethoxypropionate, methyl 3-methoxypropionate, ethyl 2-hydroxypropionate and ethyl lactate; and ketones, such as diacetone alcohol.

The above solvents can be used singly or as a mixture of two or more kinds. The amount of the solvent used can be properly determined according to the purpose, the coating method, etc.

Other Components

In addition to the above components, a thermal polymerization inhibitor, a surface active agent, an adhesion assistant and other additives can be used in the negative radiation-sensitive resin composition of the invention, when needed.

Thermal Polymerization Inhibitor

In the radiation-sensitive resin composition of the invention, a thermal polymerization inhibitor can be contained.

Examples of the thermal polymerization inhibitors include pyrogallol, benzoquinone, hydroquinone, Methylene blue, tert-butyl catechol, monobenzyl ether, methylhydroquinone, amylquinone, amyloxyhydroquinone, n-butylphenol, phenol, hydroquinone monopropyl ether, 4,4'-(1-methylethylidene)bis(2-methylphenol), 4,4'-(1-methylethylidene)bis(2,6-dimethylphenol),4,4'-[1-[4-(1-(4-hydroxyphenyl)-1-methylethyl)phenyl]ethylidene]bisphenol, 4,4',4''-ethylidenetris(2-methylphenol), 4,4',4''-ethylidenetrisphenol and 1,1,3-tris(2,5-dimethyl-4-hydroxyphenyl)-3-phenylpropane. Such a compound is used in an amount of preferably not more than 5 parts by weight based on 100 parts by weight of the polymer (A).

Surface Active Agent

In order to improve coating property, anti-foaming property, leveling property, etc., a surface active agent can be contained in the radiation-sensitive resin composition of the invention.

As the surface active agent, a commercially available one is also employable as it is. Examples of the commercially available surface active agents include BM-1000 and BM-1100 (all available from BM Chemy Co.), Megafac F142D, F172, F173 and F183 (all available from Dainippon Ink & Chemicals, Inc.), Fluorad FC-135, FC-170C, FC-430 and FC-431 (all available from Sumitomo 3M Ltd., Japan), Surflon S-112, S-113, S-131, S-141 and S-145 (all available from Asahi Glass Co., Ltd), and SH-28PA, SH-190, SH-193, SZ-6032 and SF-8428 (all available from Dow Corning Toray Silicon Co., Ltd.).

The surface active agent is used in an amount of preferably not more than 5 parts by weight based on 100 parts by weight of the polymer (A).

Adhesion Assistant

In order to enhance adhesion of the radiation-sensitive resin film of the invention to a chip base, an adhesion assistant can be used in the resin film. As the adhesion assistant, a functional silane coupling agent is preferable.

The functional silane coupling agent means a silane coupling agent having a reactive substituent, such as a carboxyl group, a methacryloyl group, an isocyanate group or an epoxy group.

Examples of the functional silane coupling agents include trimethoxysilylbenzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane and β-(3,4-epoxycyclohexyl)ethyltrimethoxysilane.

The functional silane coupling agent is used in an amount of preferably not more than 20 parts by weight based on 100 parts by weight of the polymer (A).

Other Additives

In order to carry out fine control of solubility of the radiation-sensitive resin film of the invention in an alkali developing solution, the following compounds can be added to the coating solution in the formation of the resin film. That is to say, there can be added:

monocarboxylic acids, such as acetic acid, propionic acid, n-butyric acid, isobutyric acid, n-valeric acid, isovaleric acid, benzoic acid and cinnamic acid;

hydroxymonocarboxylic acids, such as lactic acid, 2-hydroxylactic acid, 3-hydroxylactic acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid and syringinic acid;

polycarboxylic acids, such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, trimellitic acid, pyromellitic acid, cyclopentanetetracarboxylic acid, butanetetracarboxylic acid and 1,2,5,8-naphthalenetetracarboxylic acid; and acid anhydrides, such as itaconic anhydride, succinic anhydride, citraconic anhydride, dodecenylsuccinic anhydride, tricarballylic anhydride, maleic anhydride, hexahydrophthalic anhydride, methyltetrahydrophthalic anhydride, hymic anhydride, 1,2,3,4-butanetetracarboxylic dianhydride, cyclopentanetetracarboxylic dianhydride, phthalic anhydride, pyromellitic anhydride, trimellitic anhydride, benzophenonetetracarboxylic anhydride, ethylene glycol bisanhydride trimellitate and glycerol trisanhydride trimellitate.

In the radiation-sensitive resin film of the invention, a filler, a colorant, a viscosity modifier, etc. can be further contained, when needed.

Examples of the fillers include silica, alumina, talc, bentonite, zirconium silicate and powdery glass. Examples of the colorants include extender pigments, such as alumina white, clay, barium carbonate and barium sulfate; inorganic pigments, such as zinc white, white lead, chrome yellow, red lead, ultramarine, Prussian blue, titanium oxide, zinc chromate, red iron oxide and carbon black; organic pigments, such as Brilliant Carmine 6B, Permanent Red 6B, Permanent Red R, Benzidine Yellow, Phthalocyanine Blue and Phthalocyanine Green; basic dyes, such as magenta and Rhodamine; direct dyes, such as Direct Scarlet and Direct Orange; and acid dyes, such as Roserin and Metanil Yellow.

Examples of the viscosity modifiers include bentonite, silica gel and aluminum powder.

These additives may be used in any amount provided that the amount thereof is within limits not detrimental to the object of the present invention, and preferably, the amount is not more than 50% by weight based on the total 100% by weight of the components (A), (B) and (C).

By the use of the radiation-sensitive resin composition of the invention, wettability of the resin film by a developing solution can be improved, and moreover, wettability of the resin film by a plating solution in the plating step can be improved. Therefore, a plated shaped article of a large thickness such as a bump or a wiring can be more precisely formed, and besides, plating defects in the plating step can be inhibited. Therefore, the composition can be preferably used for producing a plated shaped article, such as a bump or a wiring of an integrated circuit device.

The process for producing a plated shaped article according to the invention comprises:

(1) a step of forming a resin film composed of the negative radiation-sensitive resin composition on a wafer having a barrier metal layer, (2) a step of exposing the resin film and then developing the resin film to form a pattern, (3) a step of depositing an electrode material by electroplating using the pattern as a mold, and (4) a step of stripping the remaining resin film and then removing the barrier metal by etching.

The resin film formed in the step (1) can be obtained by applying the resin composition of the invention onto a wafer and drying the composition. Further, the resin film can be obtained also by the use of the below-described transfer film of the invention, and specifically, the resin film can be obtained by transferring a resin film onto a wafer from the transfer film.

The transfer film of the invention has a resin film composed of the negative radiation-sensitive resin composition on a support film. Such a transfer film can be prepared by applying the negative radiation-sensitive resin composition onto a support film and drying the composition. Examples of methods to apply the composition include spin coating, roll coating, screen printing and applicator method. The material of the support film is not specifically restricted as long as the material has a strength capable of withstanding preparation and uses of a transfer film.

In the transfer film employable in the invention, the thickness of the resin film may be in the range of 20 to 100 μm.

By peeling the support film from the transfer film of the invention, a negative radiation-sensitive resin film can be obtained. The resin film thus obtained can be used for producing a plated shaped article, similarly to the case of using the composition of the invention.

EXAMPLES

The present invention is further described with reference to the following examples, but it should be construed that the invention is in no way limited to those examples.

Synthesis Example 1

Synthesis of polymer A1

In a flask equipped with a dry ice/methanol reflux condenser and purged with nitrogen, 5.0 g of 2,2'-azobisisobutyronitrile and 100 g of ethyl lactate were placed, and they were stirred until the polymerization initiator was dissolved. To the solution, 15 g of p-hydroxyphenyl methacrylamide, 5 g of α-methyl-p-hydroxystyrene, 10 g of methacrylic acid, 40 g of n-butyl methacrylate and 30 g of tricyclo[$5.2.1.0^{2,6}$]decanyl methacrylate were added, then stirring was slowly started, and the temperature was raised to 80° C. Thereafter, polymerization was carried out at 80° C. for 6 hours. After the polymerization reaction was completed, the reaction product was dropwise added to a large amount of methanol to solidify the reaction product. The resulting solids were washed with water, then redissolved in the same weight of tetrahydrofuran as that of the solids and dropwise added to a large amount of methanol to perform solidification again. The redissolution and solidification operations were carried out three times in total, and the resulting solids were vacuum dried at 40° C. for 48 hours to obtain a desired polymer A1.

Synthesis Examples 2 to 11

Syntheses of Polymers A2 to A10 and Polymers CA1 to CA2 for Comparison

Polymers A2 to A10 and CA1 to CA2 were synthesized in the same manner as in "Synthesis of polymer A1" in Synthesis Example 1, except that the types and the amounts of the compounds were changed in accordance with compositions shown in Table 1.

TABLE 1

| Copolymer | Component | | | | | | | | |
|---|---|---|---|---|---|---|---|---|---|
| | a | b | c | d | e | f | g | h | i |
| A1 | 15 |   | 5 | 10 |   |   | 40 |   | 30 |
| A2 | 15 |   |   | 15 |   |   | 40 |   | 30 |

TABLE 1-continued

| Copolymer | Component |   |   |   |   |   |   |   |   |
|---|---|---|---|---|---|---|---|---|---|
|  | a | b | c | d | e | f | g | h | i |
| A3 | 15 |  | 5 |  | 10 | 40 |  |  | 30 |
| A4 | 15 |  | 5 | 10 |  | 40 |  |  | 30 |
| A5 | 15 |  | 5 | 10 |  |  | 40 | 30 |  |
| A6 |  | 15 | 5 | 10 |  | 30 |  | 40 |  |
| A7 |  | 15 |  | 15 |  | 30 |  | 40 |  |
| A8 | 10 |  | 10 | 10 |  | 40 |  |  | 30 |
| A9 | 20 |  |  | 5 |  | 40 |  |  | 35 |
| A10 | 25 |  |  |  |  | 40 |  |  | 35 |
| CA1 |  |  | 15 | 10 |  | 30 |  | 20 | 25 |
| CA2 |  |  | 15 |  | 10 | 30 |  | 20 | 25 | a: p-hydroxyphenyl methacrylamide
b: 3,5-dimethyl-4-bezyl acrylamide
c: p-isopropenylphenol
d: methacrylic acid
e: 2-hexahydrophthaloylethyl methacrylate
f: n-butyl acrylate
g: n-butyl methacrylate
h: isobornyl methacrylate
i: tricyclo[5.2.1.0$^{2,6}$]decanyl methacrylate Example 1

Preparation of Resin Composition

The polymer A1 (100 g), Aronix M8060 (available from Toagosei Co., Ltd.) (40 g) and dimethylolpropane triacrylate (20 g) as the ethylenically unsaturated compounds (B), 2,2-dimethoxy-1,2-diphenylethane-1-one (15 g), 2,4,6-trimethylbenzoyldiphenylphosphine oxide (3 g) and 2,2'-bis(2,4-dichlorophenyl)-4,5,4',5'-tetraphenyl-1,2'-bisimidazole (5 g) as the radiation radical polymerization initiators (C), NBX-15 (available from Neos Co. Ltd.) (0.3 g) as a surface active agent and ethyl lactate (90 g) as a solvent were mixed and stirred to give a homogeneous solution. This composition solution was filtered through a capsule filter having a pore diameter of 10 μm to obtain a radiation-sensitive resin composition.

Preparation of Copper Sputtered Substrate

On a silicone wafer substrate having a diameter of 4 inches, TiW was sputtered in a thickness of about 1000 Å, and thereon was further sputtered copper in a thickness of 3000 Å to form a conductive layer. This substrate provided with the conductive layer is referred to as a "copper sputtered substrate" hereinafter.

Formation of Pattern

The copper sputtered substrate was coated with the resin composition by means of a spin coater and then heated on a hot plate at 120° C. for 5 minutes to form a resin film having a thickness of 80 μm. Subsequently, the resin film was irradiated with ultraviolet light of 1000 to 2000 mJ/cm$^2$ using an extra-high pressure mercury lamp (OSRAM HBO, output: 1,000 W) through a pattern mask. The exposure light quantity was confirmed by an illuminance meter (UV-M10 (illuminance meter, manufactured by ORC Manufacturing Co., Ltd.) to which a probe UV-42 (receptor) had been connected). The resin film was developed at room temperature using a 2.38 wt % tetramethylammonium hydroxide aqueous solution, then washed with running water and subjected to nitrogen blowing to form a pattern. This substrate provided with the pattern is referred to as a "patterning substrate" hereinafter.

Formation of Plated Shaped Article

The patterning substrate was subjected to ashing treatment with oxygen plasma (output: 100 W, oxygen flow rate: 100 ml, treating time: 1 minute) as pretreatment for electroplating, to make the patterning substrate hydrophilic. Subsequently, the substrate was subjected to copper electroplating and then immersed in THB-S17 (stripping solution, available from JSR Corporation) at 30° C. for 20 minutes with stirring, to obtain a test specimen. The electroplating was carried out at 25° C. for 40 minutes at 3A/dm$^2$ using Microfab CU200 (available from Electroplating Engineers of Japan Ltd.) as a plating solution, whereby a bump having a height of 60 μm was formed. This substrate provided with the plated shaped article is referred to as a "plated substrate" hereinafter.

Evaluation of Resolution

The patterning substrate was observed under a scanning electron microscope to measure resolution. The resolution was judged by a resolved image of a square pattern of 50 μm×50 μm. A case where the pattern was resolved without a residue of a resist and the resolved image had a side wall angle of 85 to 95° was evaluated as "AA", and a case other than this case was evaluated as Evaluation of Adhesion A section of the resist cured film after development was observed under a scanning electron microscope to evaluate adhesion of the film to the substrate.

A case where lifting of a resist was not observed in the periphery of the opening or at the edge of the wafer was evaluated as "AA", and a case where lifting of a resist or peeling of a resist was observed was evaluated as "BB".

Evaluation of Wettability by Plating Solution

The plated substrate was observed under a light microscope, and wettability by a plating solution was evaluated based on the criteria that the patterning substrate surface has affinity for a plating solution and no plating defect takes place because air bubbles inside the pattern are completely removed.

A case where any plating defect was not present at all or plating defects of less than 5% were present in the plated substrate was evaluated as "AA", a case where plating defects of 5 to 30% were present in the plated substrate was evaluated as "BB", and a case where plating defects of more than 30% were present in the plated substrate was evaluated as "CC".

Evaluation of Plating Resistance

Evaluation of plating resistance was carried out based on the criteria that the plating shape after stripping is a transferred one from the resist pattern, that is, the bump width is within 103% of the resist pattern and deposition does not occur at the resist opening because the plating solution does not come out from the opening. A case where these two requirements were satisfied was evaluated as "AA", and a case where these two requirements were not satisfied was evaluated as "BB".

Evaluation of Strippability

The test specimen from which the cured film had been stripped in the above manner was observed under a scanning electron microscope to evaluate strippability.

A case where no residue was observed was evaluated as "AA", and a case where a residue was observed was evaluated as "BB".

All the results are set forth in Table 3.

Examples 2 to 18

Radiation-sensitive liquid resin compositions were prepared in the same manner as in Example 1, except that the compounding components and ratios were changed as shown in Table 2. Then, properties of the resulting radiation-sensitive resin films and cured films were evaluated in the same manner as in Example 1. The results are set forth in Table 3.

Comparative Examples 1 to 5

Radiation-sensitive liquid resin compositions were prepared in the same manner as in Example 1, except that the compounding components and ratios were changed as shown in Table 2. Then, properties of the resulting radiation-sensitive resin films and cured films were evaluated in the same manner as in Example 1. The results are set forth in Table 3.

TABLE 2

| | Polymer (A) (part(s)) | Ethylenically unsaturated compound (part(s)) | | | | | Radical polymerization initiator (part(s)) | | | | |
|---|---|---|---|---|---|---|---|---|---|---|---|
| | | B1 | B2 | B3 | B4 | B5 | C1 | C2 | C3 | C4 | C5 |
| Ex. 1 | A1 100 | 40 | | 20 | | | 15 | 2 | 5 | | |
| Ex. 2 | A1 100 | 40 | | 20 | | | 15 | 6 | | | |
| Ex. 3 | A1 100 | 50 | | | | | 15 | 6 | | | |
| Ex. 4 | A2 100 | 40 | | 20 | | | 15 | 2 | 5 | | |
| Ex. 5 | A2 100 | 50 | | | | | 15 | 6 | | | |
| Ex. 6 | A3 100 | 40 | | 20 | | | 15 | 6 | | | |
| Ex. 7 | A4 100 | 40 | | 20 | | | 15 | 6 | | | |
| Ex. 8 | A5 100 | 40 | | 20 | | | 15 | 6 | | | |
| Ex. 9 | A6 100 | 40 | | 20 | | | 15 | 6 | | | |
| Ex. 10 | A7 100 | 40 | | 20 | | | 15 | 6 | | | |
| Ex. 11 | A8 100 | 40 | | 20 | | | 15 | 6 | | | |
| Ex. 12 | A9 100 | 40 | | 20 | | | 15 | 6 | | | |
| Ex. 13 | A10 100 | 40 | | | 20 | | 15 | 6 | | | |
| Ex. 14 | A1 100 | 40 | 20 | | | | 15 | 6 | | | |
| Ex. 15 | A1 100 | 40 | | 20 | | | 15 | 6 | | | |
| Ex. 16 | A1 100 | 40 | | | | 20 | 15 | 6 | | | |
| Ex. 17 | A1 100 | 40 | | 20 | | | | | 4 | 4 | 2 |
| Ex. 18 | A1 100 | 40 | | 20 | | | | | 4 | 2 | 2 |
| Comp. Ex. 1 | CA1 100 | 50 | | | | | 15 | 6 | | | |
| Comp. Ex. 2 | CA1 100 | 40 | | 20 | | | 15 | 6 | | | |
| Comp. Ex. 3 | CA1 100 | 40 | | 20 | | | 15 | 2 | 5 | | |
| Comp. Ex. 4 | CA2 100 | 40 | | 20 | | | 15 | 6 | | | |
| Comp. Ex. 5 | CA2 100 | 40 | | 20 | | | 15 | 2 | 5 | | |

B1: Aronix M8060 (available from Toagosei Co., Ltd.)
B2: pentaerythritol triacrylate
B3: trimethylolpropane triacrylate
B4: dimethyloltricyclodecane diacrylate
B5: dipentaerythritol pentaacrylate
C1: 2,2-dimethoxy-1,2-diphenylethane-1-one
C2: 2,4,6-trimethylbenzoyldiphenylphosphine oxide
C3: 2,2'-bis(2,4-dichlorophenyl)-4,5,4',5'-tetraphenyl-1,2'-bisimidazole
C4: 4,4'-bis(diethylamino)benzophenone
C5: mercaptobenzothiazole

TABLE 3

| | Resolution (pattern shape) | Adhesion | Plating solution wettability | Plating solution resistance | Strippability |
|---|---|---|---|---|---|
| Ex. 1 | AA | AA | AA | AA | AA |
| Ex. 2 | AA | AA | AA | AA | AA |
| Ex. 3 | AA | AA | AA | AA | AA |
| Ex. 4 | AA | AA | AA | AA | AA |
| Ex. 5 | AA | AA | AA | AA | AA |
| Ex. 6 | AA | AA | BB | AA | AA |
| Ex. 7 | AA | AA | BB | AA | AA |
| Ex. 8 | AA | AA | AA | AA | AA |
| Ex. 9 | AA | AA | AA | AA | AA |
| Ex. 10 | AA | AA | AA | AA | AA |
| Ex. 11 | AA | AA | BB | AA | AA |
| Ex. 12 | AA | AA | AA | AA | AA |
| Ex. 13 | AA | AA | AA | AA | AA |
| Ex. 14 | AA | AA | AA | AA | BB |
| Ex. 15 | AA | AA | AA | AA | BB |
| Ex. 16 | AA | AA | AA | AA | BB |
| Ex. 17 | AA | AA | AA | BB | AA |
| Ex. 18 | AA | AA | AA | BB | AA |
| Comp. Ex. 1 | AA | AA | BB | AA | AA |
| Comp. Ex. 2 | AA | AA | BB | AA | AA |
| Comp. Ex. 3 | AA | AA | BB | AA | AA |
| Comp. Ex. 4 | BB | BB | CC | AA | AA |
| Comp. Ex. 5 | BB | BB | CC | AA | AA |

What is claimed is:

1. A process for producing a plated shaped article, comprising:
   (1) a step of forming on a wafer having a barrier metal layer a resin film composed of the negative radiation-sensitive resin composition, wherein the negative radiation-sensitive resin composition comprises:
   (A) a polymer containing structural units represented by the following formula (1) or structural units represented by the following formula (1) and the following formula (2):

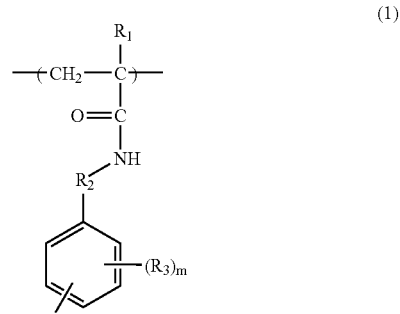

(1)

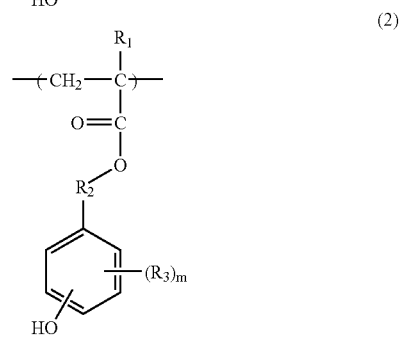

(2)

wherein $R_1$ is a hydrogen atom or a methyl group, $R_2$ is —$(CH_2)_n$—, n is an integer of 0 to 3, $R_3$ is an alkyl group of 1 to 4 carbon atoms, and m is an integer of 0 to 4, (B) a compound having at least one ethylenically unsaturated double bond, and (C) a radiation-sensitive radical polymerization initiator which is at least one compound selected from acylphosphine oxides, 2,2-dimethoxyl-1,2-diphenylethane-1-one, benzyl dimethyl ketal, benzyl-β-methoxyethyl acetal, 1-phenyl-1,2-propanedione-2-(o-ethoxycarbonyl) oxime and 2,2'-bis(2,4-dichlorophenyl)-4,5,4',5'-tetraphenyl-1-2'-bisimidazole;

(2) a step of exposing the resin film and then developing the resin film to form a pattern, (3) a step of depositing an electrode material by electroplating using the pattern as a mold, and (4) a step of stripping the remaining resin film and then removing the barrier metal by etching.

2. The method of claim 1, wherein the component (B) is contained in an amount of 30 to 80 parts by weight based on 100 parts by weight of the component (A).

3. The method of claim 1, wherein the component (C) is contained in an amount of 15 to 30 parts by weight based on 100 parts by weight of the component (A).

4. The method of claim 1, wherein the negative radiation-sensitive resin composition further comprises an organic solvent (D).

5. The method of claim 1, wherein the resin film has a film thickness of 5 to 200 μm.

6. The method of claim 1, wherein the radiation-sensitive radical polymerization initiator which is at least two compounds selected from the group consisting of acylphosphine oxides, 2,2-dimethoxyl-1,2-diphenylethane-1-one, benzyl dimethyl ketal, benzyl-β-methoxyethyl acetal, 1-phenyl-1,2-propanedione-2-(o-ethoxycarbonyl) oxime and 2,2'-bis(2,4-dichlorophenyl)-4,5,4',5'-tetraphenyl-1-2'-bisimidazole.

7. The method of claim 1, wherein (C) comprises 2,2-dimethoxy-1,2-diphenylethane-1-one and 2,4,6-trimethylbenzoyldiphenylphosphine oxide.

8. The method of claim 1, wherein the polymer contains structural units represented by formula (1) and not units of formula (2).

9. The method of claim 1, wherein the polymer contains structural units represented by the formula (1) and formula (2).

* * * * *